United States Patent [19]
Protigal et al.

[11] Patent Number: 5,307,309
[45] Date of Patent: Apr. 26, 1994

[54] MEMORY MODULE HAVING ON-CHIP SURGE CAPACITORS

[75] Inventors: Stanley N. Protigal; Web-Foo Chern; Ward D. Parkinson; Leland R. Nevill; Gary M. Johnson; Thomas M. Trent; Kevin G. Duesman, all of Boise, Id.

[73] Assignee: Micron Technology, Inc., Boise, Id.

[21] Appl. No.: 34,001

[22] Filed: Mar. 19, 1993

Related U.S. Application Data

[63] Continuation of Ser. No. 774,121, Oct. 8, 1991, abandoned, which is a continuation of Ser. No. 291,294, Dec. 27, 1988, abandoned, which is a continuation-in-part of Ser. No. 200,673, May 31, 1988, abandoned.

[51] Int. Cl.⁵ .......................... G11C 5/06; G11C 5/10; G11C 7/02; H01L 27/02
[52] U.S. Cl. ........................................ 365/63; 365/51; 365/52; 365/149; 257/312; 257/532
[58] Field of Search ..................... 365/52, 63, 230.01, 365/230.03, 149, 51; 258/312, 532, 595, 207

[56] References Cited
U.S. PATENT DOCUMENTS

| | | | |
|---|---|---|---|
| 4,164,751 | 8/1979 | Tasch, Jr. .................. | 357/306 |
| 4,266,282 | 5/1981 | Henle ........................ | 365/52 |
| 4,427,989 | 1/1984 | Anantha et al. ............ | 357/212 |
| 4,656,605 | 4/1987 | Clayton ..................... | 365/52 |
| 4,737,830 | 4/1988 | Patel et al. ................. | 257/207 |
| 4,780,846 | 10/1988 | Tanabe et al. .............. | 365/63 |

FOREIGN PATENT DOCUMENTS 0073367 4/1986 Japan.

*Primary Examiner*—Glenn Gossage

[57] ABSTRACT

A SIMM (single in-line memory module) board is provided with a plurality of semiconductor memory devices which include, as a part of each memory device, a current spike leveling capacitor. The capacitor is on the die side of circuitry connecting the memory device to the board. By connecting the on-chip capacitors of the memory devices in parallel, sufficient capacitance is provided to stabilize current to all of the memory devices.

19 Claims, 6 Drawing Sheets

MEMORY MODULE HAVING ON-CHIP SURGE CAPACITORS

CROSS REFERENCE TO RELATED PATENT APPLICATIONS

This application is a continuation of U.S. patent application Ser. No. 07/774,121, filed Oct. 8, 1991, now abandoned, which is a continuation of U.S. patent application Ser. No. 07/291,294, filed Dec. 27, 1988, now abandoned, which is a continuation-in-part of U.S. patent application Ser. No. 200,673, filed May 31, 1988, abandoned, of which U.S. patent application Ser. No. 529,679, filed May 28, 1990, also abandoned, U.S. patent application Ser. No. 07/703,235, filed May 20, 1991, also abandoned, and U.S. patent application Ser. No. 07/970,528, filed Nov. 2, 1992, now U.S. Pat. No. 5,266,821, are continuations.

FIELD OF THE INVENTION

This invention relates to arrays of semiconductor circuit devices, in which a plurality of integrated circuit chips are mounted to a printed circuit board or the like for connection to a main circuit board (mother board). The invention is directed to power supply filtering of SIMM (single in-line memory module) arrays, and similar arrays.

This invention further relates to semiconductor devices, and more specifically to circuit connections on semiconductor devices and to the reduction of voltage transients on the semiconductor devices.

BACKGROUND OF THE INVENTION

Integrated semiconductor devices are typically constructed en masse on a wafer of silicon or gallium arsenide. Each device generally takes the form of an integrated circuit (IC) die, which is attached to a lead frame with gold wires. As shown in FIG. 1, the die and lead frame are then encapsulated in a plastic or ceramic package, which is then recognizable as an IC "chip". IC chips come in a variety of forms such as dynamic random access memory (DRAM) chips, static random access memory (SRAM) chips, read only memory (ROM) chips, gate arrays, and so forth. The chips are interconnected in myriad combinations on printed circuit boards by a number of techniques, such as socketing and soldering.

Interconnections among chips arrayed on printed circuit boards are typically made by conductive traces formed by photolithography and etching processes. Semiconductor circuit devices, including DRAMs, SRAMs and gate arrays are essentially switching devices. As the output drivers within those chips create intermittent current flow on associated conductive traces, the traces behave as inductors, creating voltage surges which have the potential for creating logic errors. Other logic-damaging transient voltages, caused by voltage fluctuations at the power line and the interaction of other circuit components in the system, may also be present.

In order to render innocuous the transient voltages which regularly appear in logic circuits, decoupling capacitors are commonly used as low-frequency bypass filters.

The gold connection wires, because of their length relative to their diameter, function as inductors. As current through the gold connection wires is alternately switched on and off, voltage spikes occur. In order to reduce the effects of voltage transients, external capacitors have been installed either within the semiconductor package or on a circuit board onto which the semiconductor packages are installed. In either case, the capacitor is on an opposite side of the lead frame connection wire from the semiconductor die. This establishes the circuit shown in FIG. 2. This equivalent circuit represents an inappropriate arrangement for filtering voltage transients which would affect the circuit die, represented in FIG. 2 as box 11.

One circuit-board-mounted semiconductor chip array that is of particular interest is the SIMM (single in-line memory module). SIMM boards are typically constructed with such capacitors, which are usually located beneath or adjacent memory array circuit chips on the SIMM.

SIMM (single in-line memory module) boards are circuit arrays which consist of byte multiples of memory chips arranged on a printed circuit board or comparable mounting arrangement. The SIMM board is connected to a circuit control board by an edge connector.

The SIMM is a highly space-efficient memory board having no onboard address circuitry and which is designed to plug directly into the address, data and power-supply busses of a computer so that the randomly-addressable memory cells of the SIMM can be addressed directly by the computer's CPU rather than by a bank-switching technique commonly used in larger memory expansion boards. Memory cells on the SIMM are perceived by the computer's CPU as being no different than memory cells found on the computer's mother board. Since SIMMs are typically populated with byte multiples of DRAMs, for any eight bit byte or sixteen bit byte or word of information stored within a SIMM, each of the component bits will be found on a separate chip and will be individually addressable by column and row. One edge of a SIMM module is a card-edge connector, which plugs into a socket on the computer which is directly connected to the computer busses required for powering and addressing the memory on the SIMM.

The control board may be any of a number of circuits which address memory arrays. Examples include computer mother boards, daughter boards which plug into a mother board, wherein the daughter board functions as a mother board for the SIMM module, peripheral devices with a capability of using add-on memory, and special purpose equipment which uses memory. It is also possible to use small modules of arrays of similar circuits for purposes other than memory applications.

The capacitor on the SIMM mounted external to the memory chips establishes the inappropriate arrangement for filtering voltage transients. Therefore, it is desirable to provide capacitance on the other side of the inductor, i.e., the side of the inductor that the device is connected to.

Present SIMM boards are provided with surface-mounted decoupling capacitors, which cannot be seen in plan view. In the usual case, one decoupling capacitor is mounted beneath each DRAM chip, with connections between buss voltage ($V_{CC}$) input and the connection to ground. The $V_{CC}$ buss and the ground-plane buss on circuit die 11 are not visible in a plan view, since those particular buss traces are located between two of the board's six layers.

In most cases, each of the module's decoupling capacitors are connected in parallel between the $V_{CC}$ buss and the ground plane buss. As long as the dielectric of each of the eight capacitors is intact, the module is functional. However, a short in any one of the eight capacitors will result in the $V_{CC}$ buss becoming shorted to the ground-plane buss, whereupon the module will begin to draw an inordinate amount of current which will invariably result in its destruction.

Decoupling capacitors of the surface-mount type are particularly susceptible to shorting, since they have no leads to thermally isolate them as they are soldered to a circuit board with infrared energy, at temperatures of up to approximately 370° C. (700° F.). Even if a surface-mount capacitor survives the mechanical shock generated by the soldering process, the capacitor is still vulnerable to other types of mechanical stress. For example, by simply bending a SIMM having surface-mounted capacitors, the capacitors may be compromised. And, even if a SIMM passes testing (an indication that the decoupling capacitors are at least not shorted), it may have a relatively high failure rate when placed in use. SIMMs of the type shown in FIG. 9 have an average failure rate traceable to shorted decoupling capacitors during the first 90 days of use of roughly 3-10 per 100,000, which is a failure rate that is considered unacceptable.

Single inline packages (SIPs) are similar in design to SIMMs, except that instead of having a card edge-type connector, SIPs have which are either socketed or soldered for connection to on a buss. The problems associated with the decoupling capacitor system of SIMMs also apply to SIPs.

Most semiconductors, including all DRAMS, include capacitors. For example, a 4 Megabit DRAM includes over 4 million capacitors each. For the purpose of storing individual bits of information, these capacitors are accessed by connections through access transistors and sense amplifiers, connected through a peripheral circuit. The present invention concerns adding filter capacitance to such devices in order to provide protection from voltage transients which may not be afforded by what may be millions of other capacitors on the semiconductor device.

Semiconductor circuit devices are designed with an architecture which places their functional circuitry within a confined area, usually rectangularly shaped. At the perimeter (either outside or inside) of the rectangularly shaped area are a series of contact pads and a substantial amount of chip area which is occupied by conductor busses, but is unoccupied by active circuit devices. Unlike many of the circuit elements on a semiconductor circuit device, filter capacitors need not be built to precise specifications. It is therefore, possible to utilize perimeter areas and portions of semiconductor chip area which form major border areas between active portions of the semiconductor circuit device.

There is a significant advantage to any added circuit elements being on the same side of a chip wafer as other circuit elements, because of manufacturing techniques and tolerances. Conventionally, semiconductor circuit devices are arrayed on one side of a die wafer. It would therefore be advantageous to design a filtering element which would not significantly expand the die area (chip area) required for each die.

There is a certain portion of the die area which is not particularly suitable for active circuitry. This includes chip area occupied by bus lines, which are normally metallization which overlays most or all of the patterned layers which make up the active circuitry on the die.

SUMMARY OF THE INVENTION

In accordance with the present invention, capacitance filtering is provided for a circuit having an array of similar semiconductor circuit devices, such as a SIMM (single in-line memory module) array of semiconductor circuit devices. The semiconductor circuit devices are formed with capacitors in border areas, including perimeter border areas an intermediate border areas.

DETAILED DESCRIPTION OF THE PREFERRED EMBODIMENTS

Figure 1:
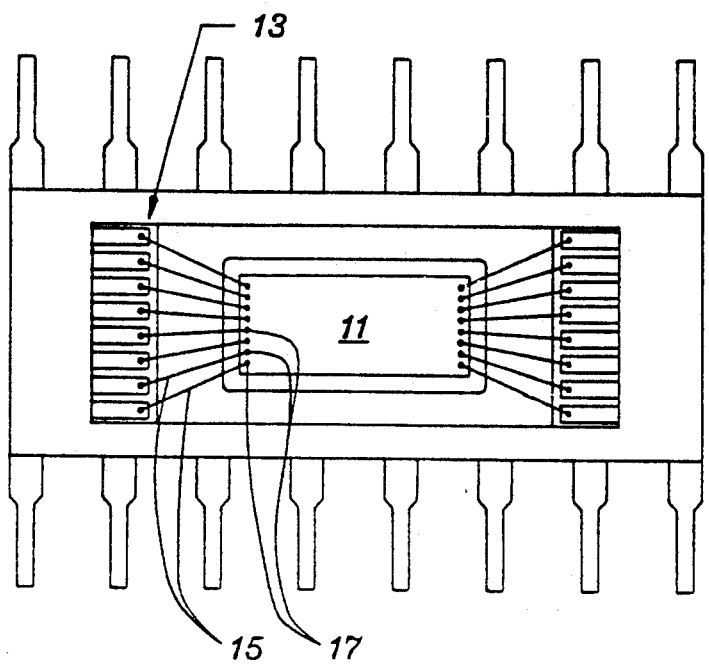
FIG. 1 shows a top view of a semiconductor device attached by pads to the lead frame.
Figure 2:
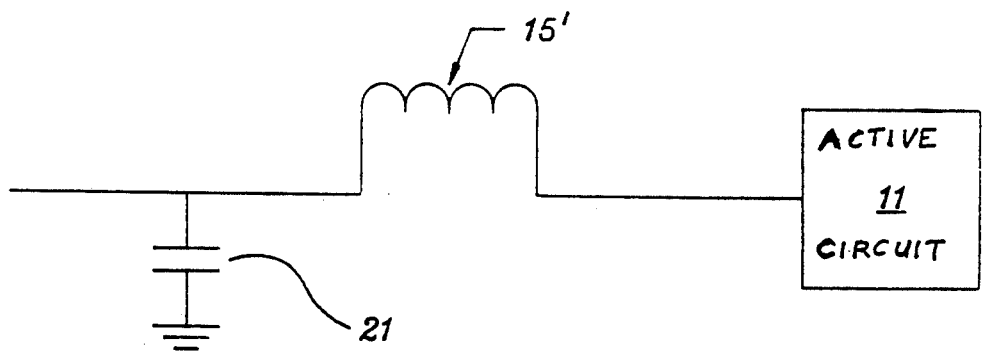
FIG. 2 shows an equivalent circuit of a semiconductor device connected to a lead wire and an off-chip capacitor.
Figure 3:
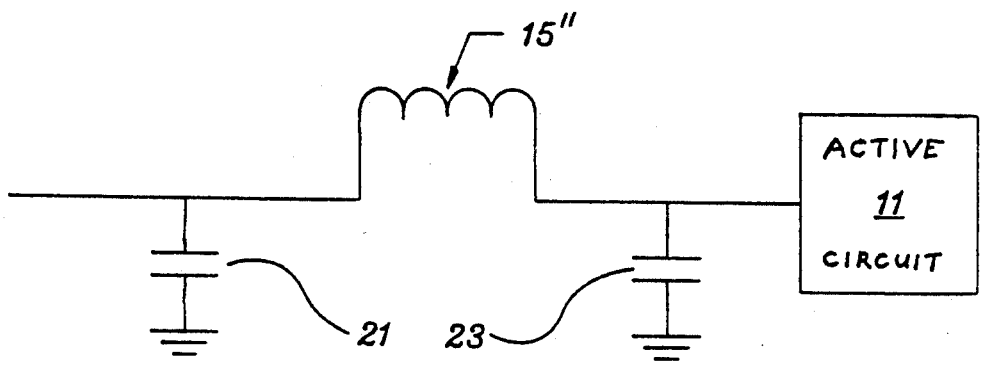
FIG. 3 shows an equivalent circuit of a semiconductor circuit device connected through a lead frame connection wire and having an on-chip decoupling capacitor.

Referring to FIG. 1, a semiconductor device includes a die 11 which is connected to a leadframe 13 by a priority of lead wires 15. The lead wires 15 are attached to the die 11 at pads or contact points 17. The lead wires 15 function as inductors, as schematically shown in FIGS. 2 and 3. While an external capacitor 21 is often provided, appropriate filter capacitance would be located on the die side of the lead wire 15, as schematically shown in FIG. 3, at 23.

Figure 4:
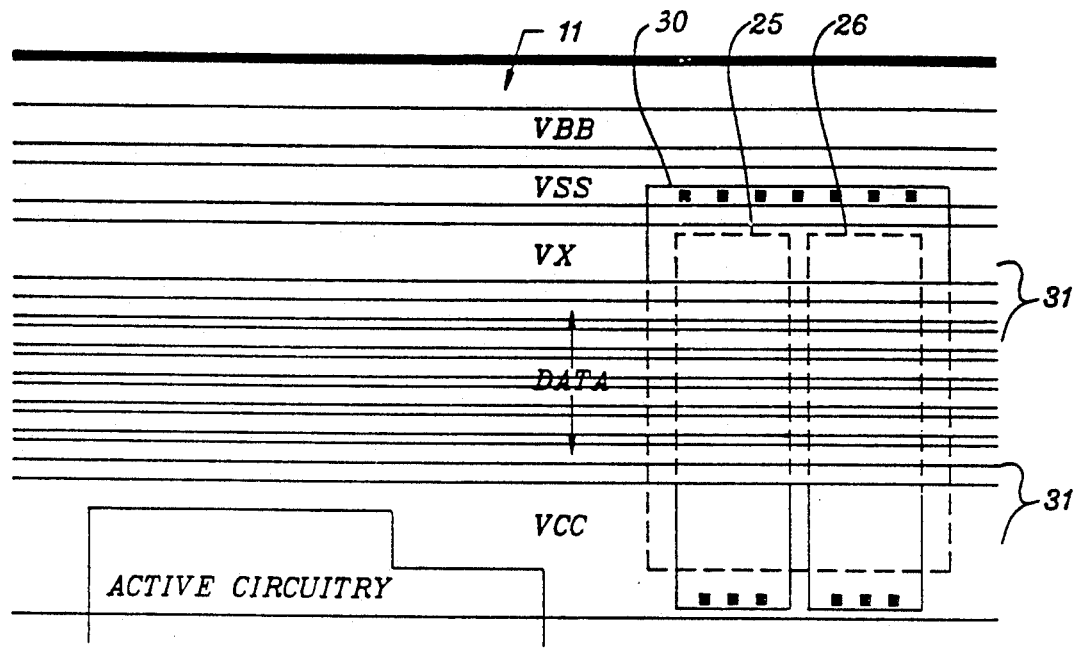
FIG. 4 shows a top view of a semiconductor, which incorporates a decoupling capacitor.

FIG. 4 shows details of one end of the die 11 constructed with the present invention, a pair of capacitors are defined by an active area of the substrate 30 and a polysilicon (poly) layer which is formed into strips 25, 26. The active area 30 is in electrical communication with a first bus $V_{SS}$. The poly strips 25, 26 are in electrical communication with a second bus line $V_{CC}$. Oxide is used to separate the poly 25, 26 from the active area 30.

The capacitors defined by the strips 25, 26 are on a location of the circuit die 11 which underlies VX and $V_{CC}$, as well as other busses 31. The buses 31 (including VX and $V_{CC}$) are typically metallization layers, and real estate occupied by the busses 31 cannot be used for most types of active circuitry. This is because active circuitry requires utilization of layers as outputs, which in this case is prevented by the buses 31 which are used for routing signals from the left end to the right end of the chip.

Figure 5:
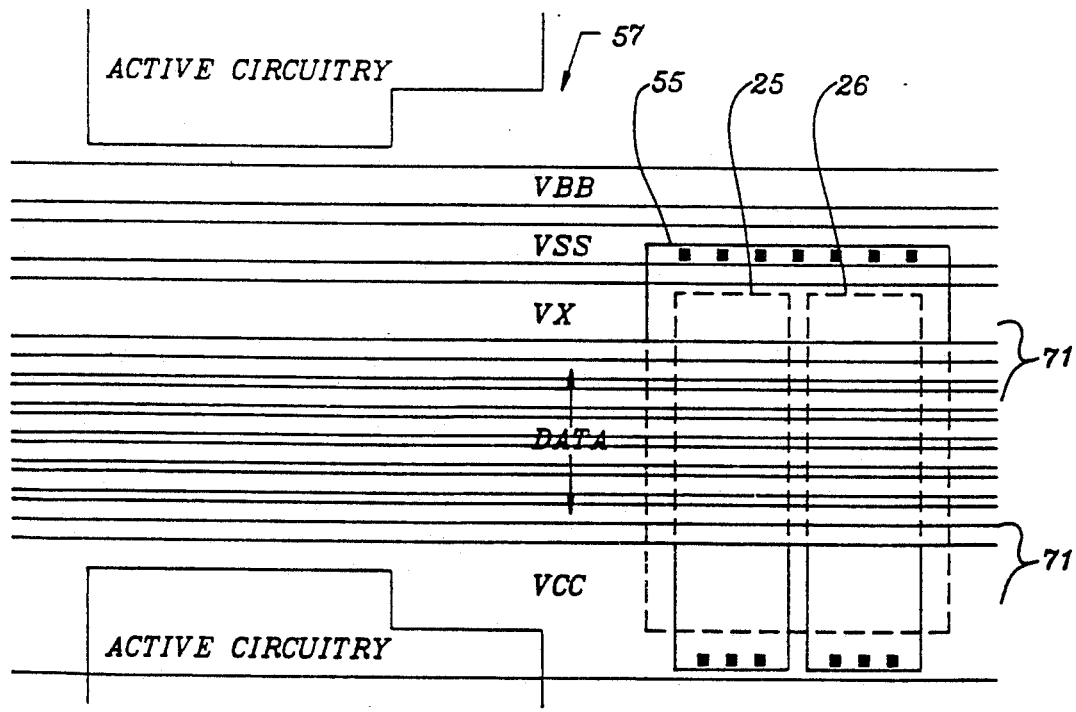
FIG. 5 shows a top view of a semiconductor device, in which a decoupling capacitor is placed along an intermediate boundary area of the chip architecture.

FIG. 5 shows a configuration in which a pair of capacitors are defined by an active substrate area 55 along an intermediate portion of a semiconductor die 57. A plurality of poly strips 25, 26 superimposed over the active poly area define a plurality of capacitors. Circuit buses 71 are superimposed over the capacitors, so that the capacitors do not occupy real estate that could be used for most active circuit devices.

The invention has been described in terms of connection to circuit busses which have external connections. It is possible that an additional circuit may be placed between the bus and an external connection. A likely example of such an additional circuit would a voltage regulating circuit. It is possible to connect the capacitor to a bus which extends between such an additional circuit and a main portion of the integrated circuit device.

Figure 6:
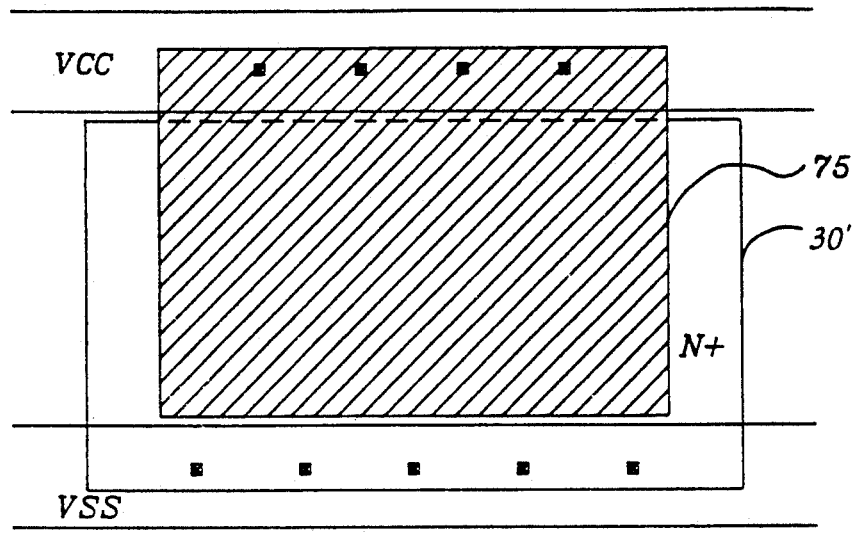
FIGS. 6 and 7 show connection arrangements for N-channel and P-channel capacitors, respectively.
Figure 7:
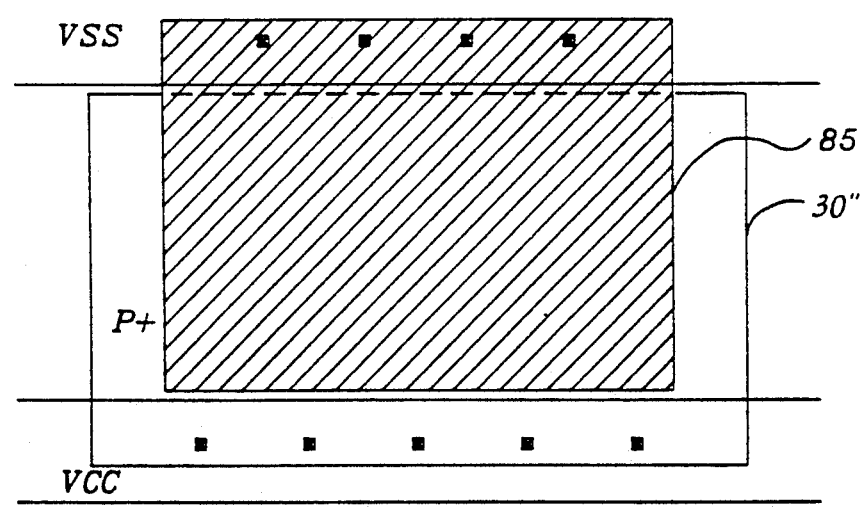

The present embodiment contemplates the use of N channel capacitors, with $V_{SS}$ connected to active area 30' and $V_{CC}$ connected to poly 75. This is shown in FIG. 6. It is possible construct P channel capacitors, with $V_{CC}$ connected to active area 30" and $V_{SS}$ connected to poly 85. This is shown in FIG. 7. Each of these may be an enhancement mode capacitor, which has a preferential voltage polarity. It is also possible to form these capacitors as depletion mode capacitors.

Figure 8:
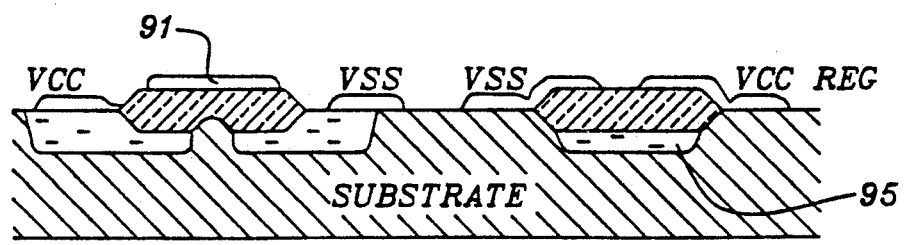
FIG. 8 shows a cross-sectional view of an arrangement in which two capacitors are connected in series in order to increase breakdown voltage.

It may also be the case that two capacitors may be connected in series in order to increase the total breakdown voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 8.

Figure 9:
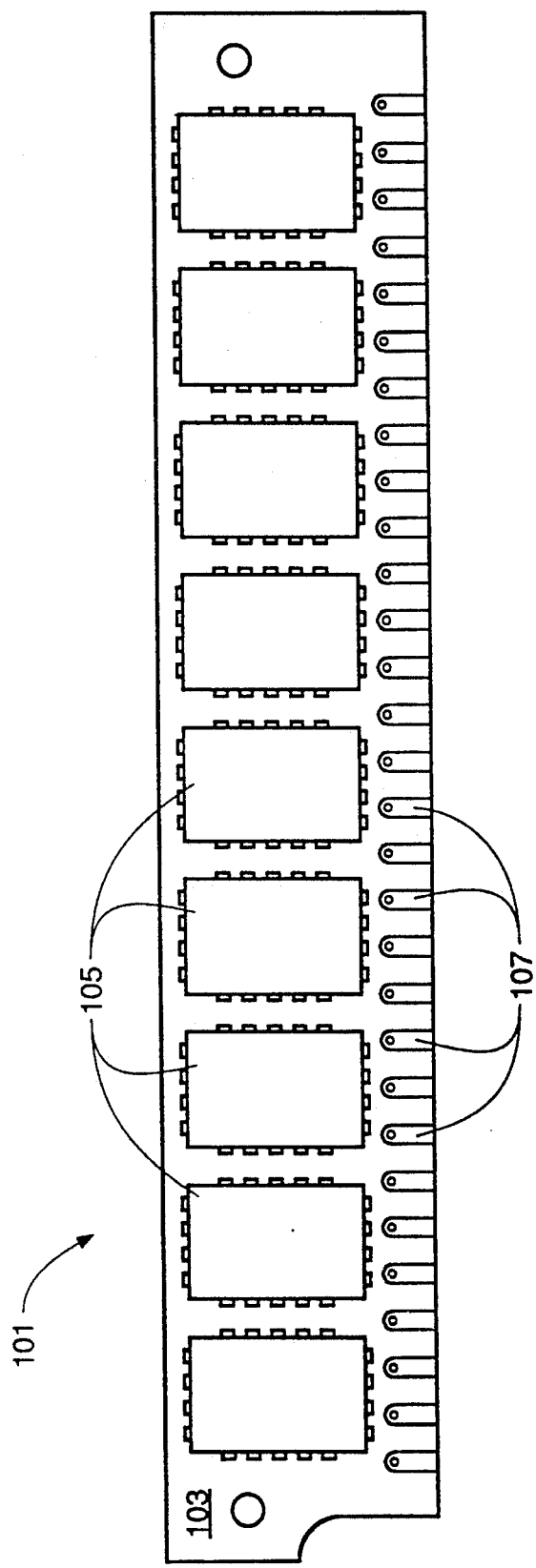
FIG. 9 shows a SIMM module constructed in accordance with the present invention.
Figure 10:
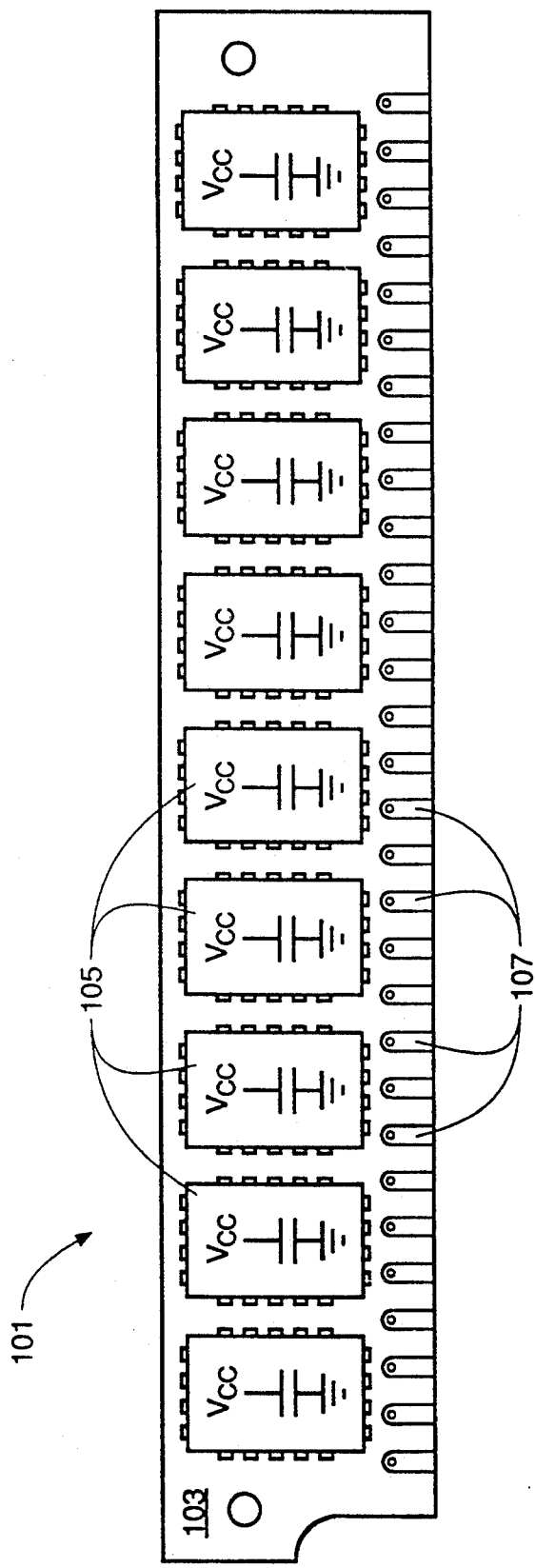
FIG. 10 shows a parallel arrangement of capacitors on a memory array.
Figure 11:
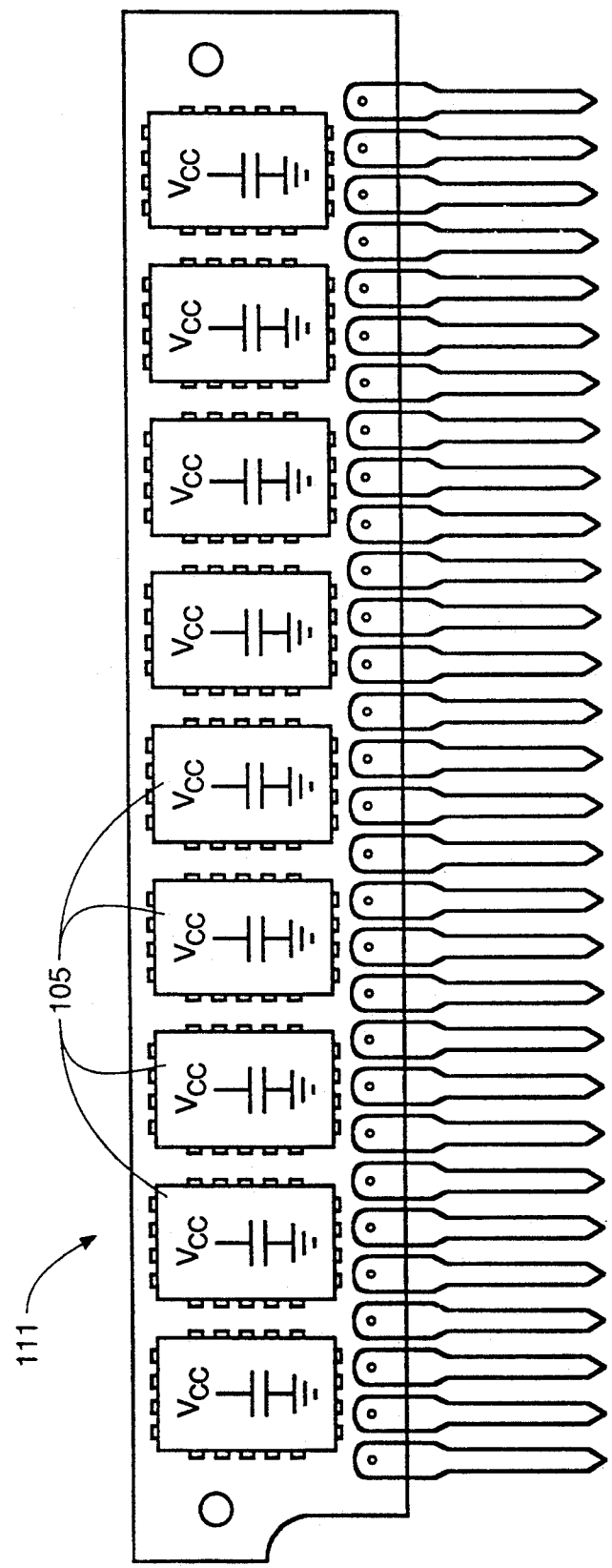
FIG. 11 shows the use of a SIP board.

FIG. 9 shows a SIMM (single in-line memory module) board 101, which consists of a printed circuit board 103, on which are mounted a plurality of semiconductor memory devices such as DRAMs 105. The printed circuit board 103 includes an edge connector 107, which extends from the printed circuit board 103 in order to permit the card 101 to be plugged into a computer bus (not shown) on a computer. The computer bus has a capability of addressing the DRAMs 105 on the board, in a predetermined sequence as defined by the SIMM protocol. Typically, an entire row of DRAMs 105 are simultaneously addressed to obtain a byte of information. Other addressing schemes are, of course, possible. FIGS. 10 and 11 show the use of capacitors on the DRAMs 105.

While SIMM boards are being described, a SIP (single in-line package) board, such as board 111, shown in FIG. 11, which uses a connector to connect an array of similar components with parallel address circuitry through a connector, may also be used with the invention.

By providing a capacitor as a part of the individual DRAMs 105, the SIMM board 101 does not have to be constructed with discrete capacitors mounted to the board. As mentioned, having a capacitor on the die serves to filter the effects of leadwire inductance. Further, since the SIMM board includes byte multiples of DRAMs, the capacitors on board each chip are connected in parallel. While this does not increase the capacitance on the die side of the leadwires, the total capacitance is thereby increased, with the added benefit that some capacitance is on the die side of the leadwire of each chip.

The elimination of discrete capacitors further eliminates a failure mode. It has been found that as many as one in 10,000 discrete capacitors has failed subsequent to burn-in. This had resulted in an added field failure rate of close to one in 1000 for a 8 or 9 device part. Eliminating the discrete capacitors is believed to significantly reduce this failure rate.

There is a possibility that the impedance of the multiple rows of the DRAMs 105 results in a mismatch (of impedance) of multiplexed RAS and CAS signal lines if the signals are intended for use with a single row of DRAMs. In order to cause the impedance to match that of inputs, termination capacitors (not shown) may be used to compensate for the shifted impedance load of the DRAMs caused by the multiple rows of DRAMs 105. The termination capacitors may be discrete elements, even if load capacitors are incorporated onto the DRAMs 105.

What has been described is a specific embodiment of the invention. The invention is expected to be able to work with other memory devices, such as SRAMS and VRAMS. It is anticipated that variations can be made on the preferred embodiment and therefore, the invention should be read as limited only by the claims.

We claim:

1. A memory array including a plurality of semiconductor memory devices arranged in a manner such that memory information is obtained by addressing a bit of information from each of a selected number of the memory devices in the array in a format, and the format of bits forms a byte of memory data such that each byte includes a bit from each memory device in said selected number of the memory devices, and wherein the bits are addressed as rows and columns of information in a matrix on each memory device and the plurality of semiconductor memory devices are addressed in said bytes, each memory device including a die having a plurality of active circuit devices arrayed on a semiconductor substrate and a plurality of conductive lines extending along the substrate between the active circuit devices and external connection points on the die, each memory device having:

a capacitor comprising an additional conductive layer, wherein one electrode of the capacitor is formed in an active area of the substrate and a second electrode of the capacitor is formed from the additional conductive layer, each capacitor being in electrical communication with at least one of said conductive lines; and wherein the capacitors on at least two of the memory devices being connected in parallel with at least one other capacitor on a different one of the memory devices, whereby the connection of the capacitors in parallel results in electrical decoupling of the memory array from external circuitry.

2. A memory array as described in claim 1, wherein, for each memory device:
   said additional conductive layer is a polysilicon layer.

3. A memory array as described in claim 1, wherein:
   the capacitors on each of said semiconductor memory devices are connected in parallel between a $V_{CC}$ buss and a $V_{SS}$ buss on their respective semiconductor memory devices.

4. A memory array as described in claim 1, wherein:

said capacitors comprise a decoupling capacitor circuit connected between a $V_{CC}$ buss and a $V_{SS}$ buss, and said capacitors are each connected in series with an additional capacitor between the $V_{CC}$ buss and $V_{SS}$ buss.

5. A memory array as described in claim 1, wherein:
said array is a multi-byte configuration comprised of substantially identical semiconductor memory devices, addressed in parallel, with each semiconductor memory device contributing one bit to each addressable byte of information.

6. A memory array as described in claim 1, wherein:
said array is a memory expansion module, which is a single inline memory module (SIMM).

7. A memory array as described in claim 1, wherein:
said array is a memory expansion module, which is a single inline package (SIP).

8. A memory array as described in claim 1, wherein:
information is stored into the array and retrieved from the array as high and low-state voltage signals.

9. A memory array as described in claim 1, wherein, for each memory device:
the capacitor occupies a space overlayed by a plurality of the conductive lines.

10. A memory array as described in claim 9 wherein, for each memory device:
the capacitor is in electrical communication with two of said conductive lines, and the two conductive lines remain in electrical communication with the external connection points and the semiconductor memory device during the operation of the semiconductor memory device.

11. A memory array as described in claim 9, wherein:
said conductive lines are circuit busses connected to circuits on each of the semiconductor memory devices.

12. A memory array as described in claim 11, wherein:
said conductive lines are metal conductors.

13. A memory array as described in claim 9, wherein, for each memory device:
said additional conductive layer is a polysilicon layer.

14. A memory array as described in claim 13, wherein, for each memory device, the capacitor is a first capacitor and the semiconductor memory device further comprises:
an additional capacitor located on the substrate in an area which is unoccupied by said active circuit devices and connected in series with the first capacitor,
the additional capacitor sharing a common electrode plate which extends across the unoccupied area between the said first capacitor and said additional capacitor.

15. A memory array as described in claim 9, wherein, for each memory device:
said active circuit devices and said conductive lines are located on a face side of the substrate of the semiconductor memory device and the capacitor is located on the face side.

16. A memory array as described in claim 15, wherein, for each memory device:
the capacitor is located on a portion of the semiconductor memory device which is at a perimeter of the substrate.

17. A memory array as described in claim 15, wherein, for each memory device:
the capacitor is located on a portion of the semiconductor memory device which is in a border area between adjacent regions of active circuitry on the semiconductor memory device.

18. A memory array as described in claim 15, wherein, for each memory device, the capacitor is a first capacitor and the semiconductor memory device further comprises:
an additional capacitor located on the substrate in an area which is unoccupied by said active circuit devices and connected in series with the first capacitor.

19. A memory array as described in claim 15, wherein, for each memory device, the capacitor is a first capacitor and the semiconductor memory device further comprises:
an additional capacitor located on the substrate in an area which is unoccupied by said active circuit devices and connected in series with the first capacitor,
the additional capacitor sharing a common electrode plate which extends across the unoccupied area between the said first capacitor and said additional capacitor.

* * * * *